(12) United States Patent
Shi et al.

(10) Patent No.: US 12,287,454 B2
(45) Date of Patent: Apr. 29, 2025

(54) METHOD FOR FABRICATING ANTI-REFLECTIVE LAYER ON QUARTZ SURFACE BY USING METAL-INDUCED SELF-MASKING ETCHING TECHNIQUE

(71) Applicant: INSTITUTE OF MICROELECTRONICS, CHINESE ACADEMY OF SCIENCES, Beijing (CN)

(72) Inventors: Lina Shi, Beijing (CN); Longjie Li, Beijing (CN); Kaiping Zhang, Beijing (CN); Jiebin Niu, Beijing (CN); Changqing Xie, Beijing (CN); Ming Liu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 359 days.

(21) Appl. No.: 17/310,206

(22) PCT Filed: Feb. 1, 2019

(86) PCT No.: PCT/CN2019/074465
§ 371 (c)(1),
(2) Date: Jul. 26, 2021

(87) PCT Pub. No.: WO2020/155111
PCT Pub. Date: Aug. 6, 2020

(65) Prior Publication Data
US 2022/0317338 A1 Oct. 6, 2022

(51) Int. Cl.
*G02B 1/12* (2006.01)
*B82Y 40/00* (2011.01)
(Continued)

(52) U.S. Cl.
CPC ............... *G02B 1/12* (2013.01); *B82Y 40/00* (2013.01); *G02B 1/02* (2013.01); *G02B 1/118* (2013.01);
(Continued)

(58) Field of Classification Search
None
See application file for complete search history.

(56) References Cited

U.S. PATENT DOCUMENTS 8,187,481 B1 * 5/2012 Hobbs .............. B29D 11/00432
216/67
2007/0164261 A1 * 7/2007 Miyamatsu ........... G03F 7/2041
252/582
2009/0274873 A1 * 11/2009 Shinotsuka ............ B82Y 40/00
427/372.2

FOREIGN PATENT DOCUMENTS

CN 1871530 A 11/2006
CN 102815052 A 12/2012
(Continued)

OTHER PUBLICATIONS

M. Schultz et al. New Approach for Antireflective Fused Silica Surfaces by Statistical Nanostructures, Proc. of SPIE, vol. 6883, pp. 68830N-1 to 68830N-10. (Year: 2008).*

(Continued)

*Primary Examiner* — Jiong-Ping Lu
(74) *Attorney, Agent, or Firm* — Christopher R. Christenson; Kelly, Holt & Christenson, P.L.L.C.

(57) ABSTRACT

The present disclosure provides a method for fabricating an anti-reflective layer on a quartz surface by using a metal-induced self-masking etching technique, comprising: performing reactive ion etching to a metal material and a quartz substrate by using a mixed gas containing a fluorine-based gas, wherein metal atoms and/or ions of the metal material are sputtered to a surface of the quartz substrate, to form a
(Continued)

non-volatile metal fluoride on the surface of the quartz substrate; forming a micromask by a product of etching generated by reactive ion etching gathering around the non-volatile metal fluoride; and etching the micromask and the quartz substrate simultaneously, to form an anti-reflective layer having a sub-wavelength structure.

4 Claims, 3 Drawing Sheets

(51) Int. Cl.
    *G02B 1/02*     (2006.01)
    *G02B 1/118*     (2015.01)
    *G03F 7/00*     (2006.01)

(52) U.S. Cl.
    CPC .... *G03F 7/70316* (2013.01); *G02B 2207/101* (2013.01)

(56) References Cited

FOREIGN PATENT DOCUMENTS

| | | |
|---|---|---|
| CN | 102923645 A | 2/2013 |
| CN | 103048707 A | 4/2013 |
| CN | 104386645 A | 3/2015 |
| JP | 2000-258607 A | 9/2000 |
| WO | 2014201407 A1 | 12/2014 |

OTHER PUBLICATIONS

Y.M. Song et al. Antireflective Grassy Surface on Glass Substrates with Self-Masking Dry Etching, Nanoscale Research Letters, vol. 8, paper 505, pp. 1-5. (Year: 2013).*

Wu et al., "Growth mechanism of one-step self-masking reactive-ion-etching (RIE) broadband antireflective and superhydrophilic structures induced by metal nanodots on fused silica", Optics Express, vol. 26, pp. 1361-1374. (Year: 2018).*

D. Infante et al., "Durable, superhydrophobic, antireflection, and low haze glass surfaces using scalable metal dewetting nanostructuring", Nano Research, vol. 6, pp. 429-440. (Year: 2013).*

Chinese Search Report for PCT/CN2019/074465 dated Jun. 26, 2019, 5 pages.

Wu, J., Ye, X., Sun, L., Huang, J., Wen, J., Geng, F., Zeng, Y., Li, Q., Yi, Z., Jiang, X. and Zhang, K., 2018. Growth mechanism of one-step self-masking reactive-ion-etching (RIE) broadband antireflective and superhydrophilic structures induced by metal nanodots on fused silica. Optics express, 26(2), pp. 1361-1374.

Wu Jingjun. Research on self-mask generation mechanism of high-performance anti-reflection micro-nano structure [D]. Southwest University of Science and Technology, 2018. pp. 15-40. No English Translation Available.

* cited by examiner

METHOD FOR FABRICATING ANTI-REFLECTIVE LAYER ON QUARTZ SURFACE BY USING METAL-INDUCED SELF-MASKING ETCHING TECHNIQUE

TECHNICAL FIELD

The present disclosure relates to the field of nanofabrication in the microelectronics technology, and in particular to a method for fabricating an anti-reflective layer on a quartz surface by using a metal-induced self-masking etching technique.

BACKGROUND

Fused quartz is widely used in many optical systems, such as gratings, lenses, and optical windows which are usually made of fused quartz. However, due to Fresnel reflection at the air-fused quartz interface, more than 7% of incident light is reflected from the quartz surface. Especially for the ultraviolet light with a wavelength of 193 nm, the refractive index of fused quartz is 1.5603, and the transmittance is only 90.42%. Therefore, in order to suppress the incident light loss caused by Fresnel reflection, various anti-reflective layers are developed, the anti-reflective layer with a moth-eye structure on the quartz surface raises intensive concerns due to its good mechanical properties, environmental durability, and resistance to laser damage. The sub-wavelength anti-reflective layer with the moth-eye structure suppresses the light reflection through the gradient refractive index distribution between air and quartz (the effective refractive index gradually increases from air to the quartz surface).

The fabrication of the anti-reflective layer with the moth-eye structure generally requires two steps: mask fabrication and etching. The periodic moth-eye structure generally adopts the electron beam lithography or interference lithography for fabricating the mask, and such methods are high-cost and have complicated fabrication processes. The random moth-eye structure generally adopts the metal nanoparticles generated by annealing as the mask. The size of the moth-eye structure is determined by the size of the mask. For deep ultraviolet light with a wavelength of 193 nm, a characteristic size of less than 80 nm is required. For the moth-eye structure with a period of less than 80 nm, it is difficult to quickly fabricate a large area mask by the electron beam lithography method, and the cost is high; the metal nanoparticles generated by annealing are relatively large, and it is difficult to form a mask with a characteristic size of less than 80 nm, and the metal particles tend to be remained on the quartz surface and thus affect the transmittance. Therefore, a fast, low-cost, and large-area self-masking method has been proposed.

The basic principle for self-masking is based on the grass-like structure formed in the process of reactive ion etching. The grass-like structure is derived from the micro contamination during the etching process, mainly formed by the polymerization of the products of etching. In order to etch the quartz, gases containing fluorine and carbon (for example, $CHF_3$, $SF_6$, $C_3F_8$, and $CF_4$) are usually used. During the etching process, a complicated process occurs on the surface of the sample, and fluorocarbon polymers accumulate, so as to form small clusters. However, these small clusters have poor resistance to etching as a mask, and the moth-eye structure used in the anti-reflective layer cannot be obtained.

Based on this, there is an urgent need for a self-masking etching method capable of increasing the etching depth, to solve the above technical problems.

SUMMARY

According to one aspect of the present invention, there is provided a method for fabricating an anti-reflective layer on a quartz surface by using a metal-induced self-masking etching technique, comprising: performing reactive ion etching to a metal material and a quartz substrate using a mixed gas containing a fluorine-based gas, wherein metal atoms and/or ions of the metal material are sputtered to a surface of the quartz substrate, to form a non-volatile metal fluoride on the surface of the quartz substrate; forming a micromask by a product of etching generated by reactive ion etching gathering around the non-volatile metal fluoride; and etching the micromask and the quartz substrate simultaneously, to form an anti-reflective layer having a sub-wavelength structure.

In some embodiments of the present disclosure, the fluorine-based gas is one or more of trifluoromethane, sulfur hexafluoride, octafluoropropane, and carbon tetrafluoride.

In some embodiments of the present disclosure, the metal material is one or more of aluminum, iron, silver, nickel, and copper.

In some embodiments of the present disclosure, the non-volatile metal fluoride is one or more of aluminum fluoride, iron fluoride, silver fluoride, nickel fluoride, copper fluoride.

In some embodiments of the present disclosure, said etching the micromask and the quartz substrate simultaneously comprises: using the non-volatile metal fluoride as a core for the micromask, wherein the product of etching continuously gathers around the non-volatile metal fluoride, and the micromask is etched while being self-recovered, to form a mask throughout the etching process.

In some embodiments of the present disclosure, in the anti-reflective layer having a sub-wavelength structure, a spike structure is formed in a region where the surface of the quartz substrate is covered by the micromask.

In some embodiments of the present disclosure, in the mixed gas, $O_2$ accounts for 15% to 40% of trifluoromethane, sulfur hexafluoride, octafluoropropane, and carbon tetrafluoride.

In some embodiments of the present disclosure, a quartz substrate used for 193 nanometer photolithographic projection objective lens is adopted as the quartz substrate.

In the present disclosure, the non-volatile metal fluoride is formed by sputtering the metal to the quartz surface, to improve the etching resistance of the micromask, and a deeper sub-wavelength structure may be obtained on the quartz surface to meet the requirements of the anti-reflective layer. Moreover, the fabrication process is simple and low-cost, is suitable for fast large-area fabrication, and is conducive to wide applications.

In order to make the above-mentioned objects, features, and advantages of the present invention more obvious and understandable, preferred embodiments are described in detail below in conjunction with accompanying drawings.

DESCRIPTION OF THE DRAWINGS

In order to explain the technical solutions of the embodiments of the present invention more clearly, the drawings required to be used in the embodiments will be briefly introduced below. It should be understood that the following drawings only show certain embodiments of the present

DISCRIPTION OF SIGNS

1—Metal material;
2—Quartz substrate;
3—Metal fluoride;
4—Micromask.

DESCRIPTION OF EMBODIMENTS

The present disclosure provides a method for fabricating an anti-reflective layer on a quartz surface by using a metal-induced self-masking etching technique, comprising: Step S100, performing reactive ion etching to a metal material and a quartz substrate using a mixed gas containing a fluorine-based gas, wherein the metal is sputtered to a quartz surface to form a non-volatile metal fluoride; Step S200, forming a micromask by a product of etching, i.e., fluorocarbon polymer, gathering around the metal fluoride; and Step S300, etching the micromask and the quartz substrate simultaneously, to form an anti-reflective layer having a sub-wavelength structure. In the present disclosure, the non-volatile metal fluoride is formed by sputtering the metal to the quartz surface to improve the etching resistance of the micromask, and a deeper sub-wavelength structure may be obtained on the quartz surface to meet the requirements of the anti-reflective layer. Meanwhile, the fabrication process of the present disclosure is simple and low-cost, is suitable for fast large-area fabrication, and is conducive to wide applications.

In order to make the objectives, technical solutions, and advantages of the present disclosure more clear, the present disclosure will be further described in detail in conjunction with specific examples and with reference to the accompanying drawings.

Certain embodiments of the present disclosure will be described more fully below with reference to the accompanying drawings, and some but not all of the examples will be shown. In fact, various examples of the present disclosure may be implemented in many different forms, and should not be construed as being limited to the examples described herein; relatively, these examples are provided such that the present disclosure complies with the applicable legal requirements.

Figure 1:
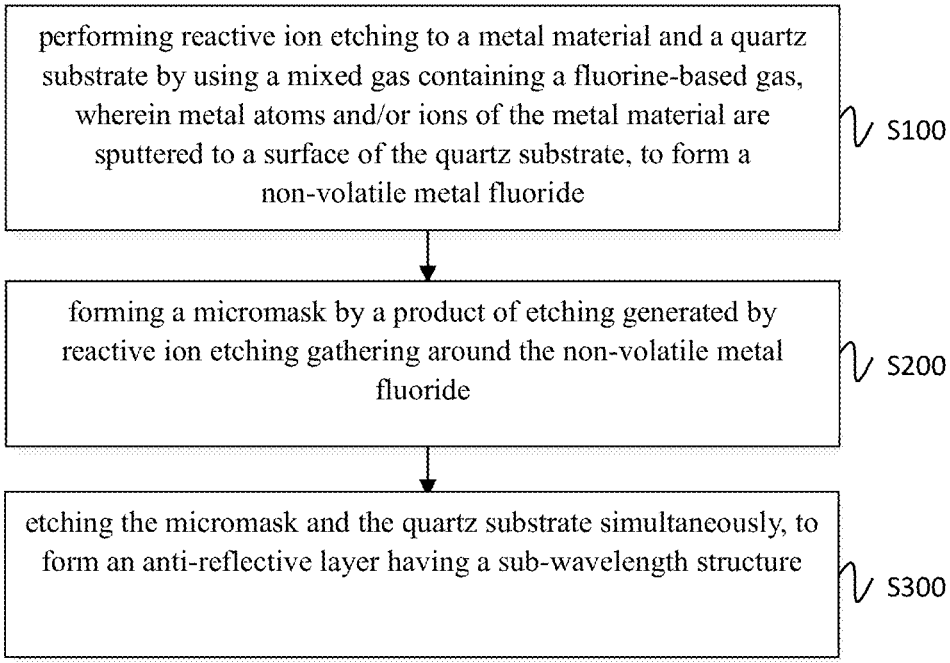
FIG. 1 is a flow diagram for the method for fabricating an anti-reflective layer on a quartz surface using a metal-induced self-masking etching technique in an example of the present disclosure.

The example of the present disclosure provides a method for fabricating an anti-reflective layer on a quartz surface by using a metal-induced self-masking etching technique. As shown in FIG. 1, said method comprises following steps.

Figure 2:
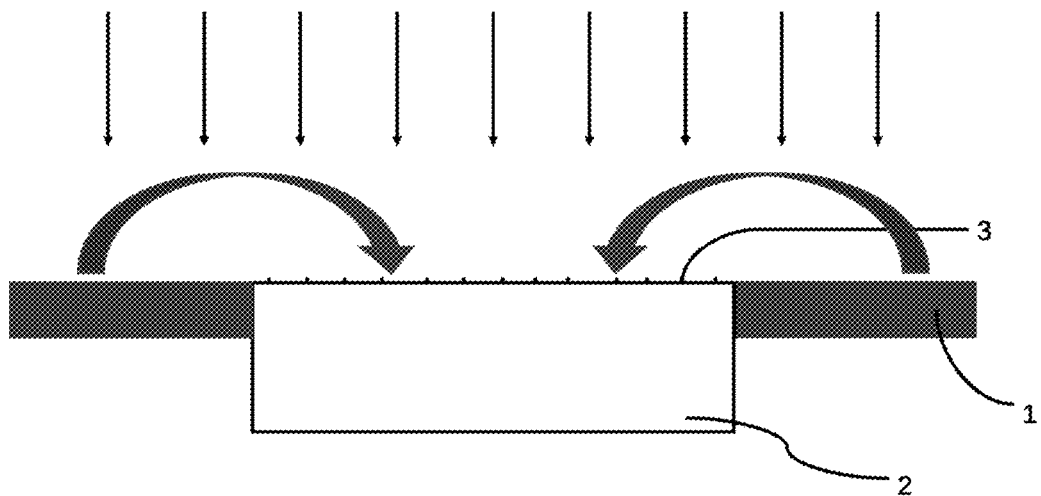
FIG. 2 is a schematic diagram for forming the non-volatile metal fluoride in an example of the present disclosure.

Step S100: Reactive ion etching was performed to a metal material 1 and a quartz substrate 2 by using a mixed gas containing a fluorine-based gas. The metal material 1 and the surface of the quartz substrate 2 were subjected to strong ion bombardment in the etching process, so that metal atoms and/or ions of the metal material 1 were sputtered to a surface of the quartz substrate 2, and a non-volatile metal fluoride 3 was formed in a part of region of the surface of the quartz substrate 2, as shown in FIG. 2.

Specifically, the metal material 1 may be, but not limited to, one or more of aluminum, iron, silver, nickel, and copper. In this example, aluminum was used, and the non-volatile metal fluoride 3 formed on the surface of the quartz substrate 2 was $AlF_3$.

Specifically, the fluorine-based gas was $CHF_3$, but not limited thereto. Further, the mixed gas was a mixed gas formed from $CHF_3$ and $O_2$, wherein $CHF_3:O_2=4:1$. It should be understood by those skilled in the skill that the proportion for the mixed gas may be in a range. The above ratio is merely a preferred value, but should not be limited thereto.

Here, it should be noted that the quartz substrate 2 of the present disclosure mainly adopted quartz applied to 193 nanometer photolithographic projection objective lens.

Figure 3:
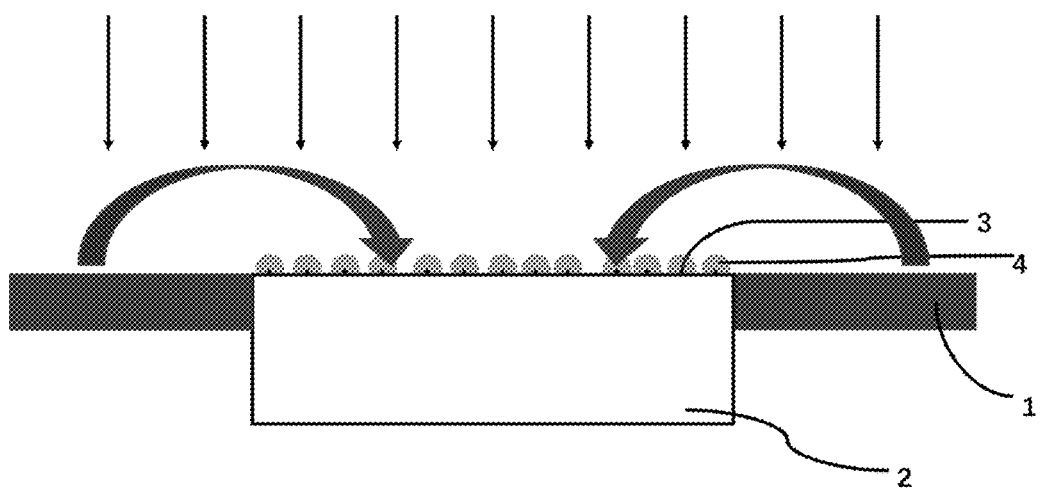
FIG. 3 is a schematic diagram for forming the micromask in an example of the present disclosure.

Step S200: A micromask 4 was formed by the fluorocarbon polymer generated by etching gathering around the non-volatile metal fluoride, as shown in FIG. 3. The fluorocarbon polymer covered the non-volatile metal fluoride, and the micromask 4 was formed in a part of region of the surface of the quartz substrate 2.

Specifically, the metal fluoride in this example was aluminum fluoride, i.e., $AlF_3$.

Figure 4:
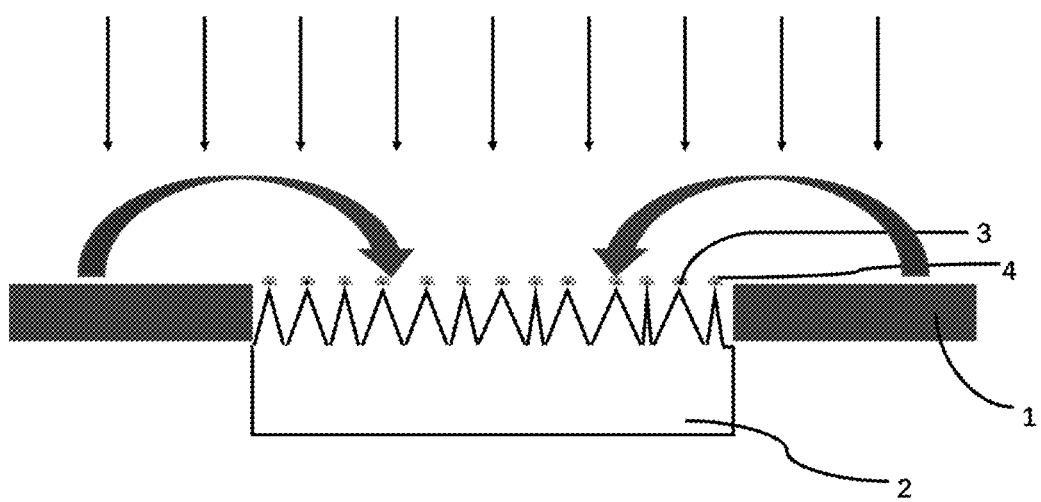
FIG. 4 is a schematic diagram for forming the sub-wavelength structure in an example of the present disclosure.

Step S300: The quartz substrate 2 and the micromask 4 were etched simultaneously, to form an anti-reflective layer having a sub-wavelength structure. The etching rate for the micromask is much slower than that for the quartz substrate, so as to form a spike structure on the surface of the quartz substrate 2, as shown in FIG. 4.

Here, it should be noted that throughout the etching process, since the non-volatile metal fluoride serves as the core for micromask, the fluorocarbon polymer continuously gathers around the metal fluoride in the etching process, which significantly improves the etching resistance of the micromask.

So far, the embodiments of the present disclosure have been described in detail with reference to the accompanying drawings. It should be noted that, in the drawings or the context of the description, the implementations that are not shown or described are all known forms to those of ordinary skill in the art, and are not described in detail. In addition, the above definitions for each element and method are not limited to various specific structures, shapes, or manners mentioned in the embodiments, and those of ordinary skill in the art may make simple changes or replacements.

Based on the above descriptions, those skilled in the art should have clear understandings on the method for fabricating an anti-reflective layer on a quartz surface by using a metal-induced self-masking etching technique in the present disclosure.

Given the above, the present disclosure provides a method for fabricating an anti-reflective layer on a quartz surface by using a metal-induced self-masking etching technique, wherein the non-volatile metal fluoride is formed by sputtering the metal to the quartz surface, to improve the etching resistance of the micromask, and a deeper sub-wavelength structure may be obtained on the quartz surface to meet the requirements of the anti-reflective layer. The fabrication process of the present disclosure is simple and low-cost, is suitable for fast large-area fabrication, and is conducive to wide applications.

It should be noted that the directional terms mentioned in the embodiments of the present invention, such as "top,"

"bottom," "up," "down," "front," "rear," "left," "right," etc., only refer to the directions in the drawings, and are not used to limit the protection scope of the present invention. In fact, the terms "top" and "bottom" mentioned in the present invention may be replaced with a "first direction" and a "second direction" opposite to the "first direction", the terms "top end" and "bottom end" may be replaced with a "first end" and a "second end" opposite to the "first end", and the terms "top portion" and "bottom portion" may be replaced with a "first terminal portion" and a "second terminal portion" opposite to the "first terminal portion." Similarly, "up," "down," "front," "rear," "left," and "right" may also be replaced as above.

It should be noted that in the context herein, the relational terms such as "first" and "second" are only used to distinguish one entity or operation from another entity or operation, and do not necessarily require or imply that there are any such actual relationships or orders among these entities or operations. Moreover, the terms "comprising," "including" or any other variants thereof are intended to encompass non-exclusive inclusion, so that a process, method, article, or device comprising a series of elements not only comprises those elements, but also comprises other elements not explicitly listed, or also comprises the elements inherent to this process, method, article, or device. Without more restrictions, the element defined by the phrase "comprising . . . " does not exclude the presence of other identical elements in the process, method, article, or device that comprises the element.

The above descriptions are merely preferred embodiments of the present invention and are not intended to limit the present invention. For those skilled in the art, the present invention may have various modifications and changes. Any modification, equivalent replacement, and improvement made within the spirit and principle of the present invention shall be included within the scope of the present invention.

Although some specific embodiments of the present invention have been described in detail through the examples, it should be understood by those skilled in the art that the above examples are merely for illustration, rather than limiting the scope of the present invention. It should be understood by those skilled in the art that the above embodiments may be modified without departing from the scope of the present invention. The scope of the present invention is defined by the appended claims.

What is claimed is:

1. A method for fabricating an anti-reflective layer on a quartz surface by using a metal-induced self-masking etching technique, comprising:

performing reactive ion etching to a metal material and a quartz substrate by using a mixed gas containing a fluorine-based gas, wherein metal atoms and/or ions of the metal material are sputtered to a surface of the quartz substrate, to form a non-volatile metal fluoride on the surface of the quartz substrate, wherein in the mixed gas, $O_2$ accounts for 15 vol. % to 40 vol. % of fluorine-based gas, wherein a quartz substrate used for 193 nanometer photolithographic projection objective lens is adopted as the quartz substrate, wherein the fluorine-based gas is octafluoropropane or sulfur hexafluoride, wherein the metal material is one or more of silver, nickel, and copper;

forming a micromask by a product of etching generated by reactive ion etching gathering around the non-volatile metal fluoride;

etching the micromask and the quartz substrate simultaneously, to form an anti-reflective layer having a sub-wavelength structure.

2. The method according to claim 1, wherein the non-volatile metal fluoride is one or more of silver fluoride, nickel fluoride, and copper fluoride.

3. The method according to claim 1, wherein said etching the micromask and the quartz substrate simultaneously comprises: using the non-volatile metal fluoride as a core for the micromask, wherein the product of etching continuously gathers around the non-volatile metal fluoride, and the micromask is etched while being self-recovered, to form a mask throughout the etching process.

4. The method according to claim 1, wherein in the anti-reflective layer having a sub-wavelength structure, a spike structure is formed in a region where the surface of the quartz substrate is covered by the micromask.

* * * * *